US010033213B2

(12) United States Patent
Dulle

(10) Patent No.: US 10,033,213 B2
(45) Date of Patent: Jul. 24, 2018

(54) SHORT CIRCUIT WAKE-UP SYSTEM AND METHOD FOR AUTOMOTIVE BATTERY WHILE IN KEY-OFF POSITION

(71) Applicant: Johnson Controls Technology Company, Holland, MI (US)

(72) Inventor: Ronald J. Dulle, Mequon, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 294 days.

(21) Appl. No.: 14/502,321

(22) Filed: Sep. 30, 2014

(65) Prior Publication Data
US 2016/0094056 A1 Mar. 31, 2016

(51) Int. Cl.
*B60L 11/18* (2006.01)
*H02J 7/00* (2006.01)
(Continued)

(52) U.S. Cl.
CPC ............ *H02J 7/007* (2013.01); *B60L 3/0046* (2013.01); *B60L 3/04* (2013.01); *B60L 11/1864* (2013.01); *B60L 11/1877* (2013.01); *B60L 11/1879* (2013.01); *G01R 31/025* (2013.01); *H01M 10/4257* (2013.01); *H01M 10/4264* (2013.01); *H01M 10/482* (2013.01); *H02H 7/18* (2013.01);
(Continued)

(58) Field of Classification Search
CPC .. H02J 7/007; H01M 10/4235; G01R 31/006; G01R 31/025; G01R 31/3606
USPC .......................................................... 320/126
See application file for complete search history.

(56) References Cited

U.S. PATENT DOCUMENTS 3,585,340 A * 6/1971 Hockenberry ......... B23H 1/024
219/69.13
3,665,253 A * 5/1972 Stefani .................... G05F 1/573
361/74
(Continued)

FOREIGN PATENT DOCUMENTS

CA 2204269 5/1996
CN 2350879 Y 11/1999
(Continued)

OTHER PUBLICATIONS http://www.mpoweruk.com/lithiumS. Seen Apr. 12, 2017.*
(Continued)

*Primary Examiner* — Robert Grant
*Assistant Examiner* — John Trischler
(74) *Attorney, Agent, or Firm* — Fletcher Yoder, P.C.

(57) ABSTRACT

The present disclosure includes an automotive battery system including a first battery that couples to an electrical system. Additionally, the first battery includes a first battery chemistry. Further, the automotive battery system includes a second battery coupled in parallel with the first battery and couples to the electrical system. Furthermore, the automotive battery system includes a first switch coupled to a positive terminal of the second battery, which electrically couples or decouples the second battery to or from the electrical system. Moreover, the automotive battery system includes a battery control unit that detects a short circuit condition of the first battery, the second battery, or both and decouples the second battery from the electrical system by opening the first switch upon detecting the short circuit condition.

21 Claims, 4 Drawing Sheets

(51) Int. Cl.
  *G01R 31/02* (2006.01)
  *H01M 10/42* (2006.01)
  *H01M 10/48* (2006.01)
  *H02H 7/18* (2006.01)
  *B60L 3/00* (2006.01)
  *B60L 3/04* (2006.01)
  *G01R 31/36* (2006.01)
  *G01R 31/00* (2006.01)

(52) U.S. Cl.
  CPC ....... *B60L 2240/545* (2013.01); *G01R 31/006* (2013.01); *G01R 31/3606* (2013.01); *H01M 2220/20* (2013.01)

(56) References Cited

U.S. PATENT DOCUMENTS

| | | | | |
|---|---|---|---|---|
| 4,024,523 A | * | 5/1977 | Arnold | G01R 31/362 320/161 |
| 4,025,860 A | * | 5/1977 | Shibata | B60L 11/1853 180/65.1 |
| 4,146,830 A | * | 3/1979 | Foster | H02J 7/008 320/160 |
| 4,187,536 A | * | 2/1980 | Govaert | H02M 3/33507 320/124 |
| 4,223,306 A | * | 9/1980 | Reimer | G01R 31/025 218/1 |
| 4,360,850 A | * | 11/1982 | Howard | B41F 9/001 361/54 |
| 4,514,694 A | * | 4/1985 | Finger | G01R 31/36 324/429 |
| 4,661,717 A | * | 4/1987 | Nishioka | G01R 31/006 307/39 |
| 4,792,743 A | * | 12/1988 | Tsujino | H02J 7/0031 320/124 |
| 4,811,154 A | * | 3/1989 | Trenkler | G01R 31/088 361/79 |
| 4,858,057 A | * | 8/1989 | Maier | H02H 3/42 361/78 |
| 4,937,528 A | * | 6/1990 | Palanisamy | G01R 31/3648 320/132 |
| 5,173,653 A | * | 12/1992 | Hochstein | H02J 7/0031 307/141 |
| 5,214,369 A | * | 5/1993 | McCrea | H02J 7/008 320/143 |
| 5,281,919 A | * | 1/1994 | Palanisamy | G01R 31/007 324/427 |
| 5,542,488 A | | 8/1996 | Nixon | |
| 5,563,496 A | * | 10/1996 | McClure | H02J 7/0081 320/128 |
| 5,583,415 A | * | 12/1996 | Fernandez | H01M 10/486 320/121 |
| 5,602,460 A | * | 2/1997 | Fernandez | H02J 7/0031 320/152 |
| 5,606,242 A | * | 2/1997 | Hull | H02J 7/0004 320/106 |
| 5,721,688 A | * | 2/1998 | Bramwell | H02J 7/0093 320/128 |
| 5,777,399 A | * | 7/1998 | Shibuya | H02J 7/0011 307/64 |
| 5,801,514 A | * | 9/1998 | Saeki | H01M 10/425 320/136 |
| 5,808,469 A | | 9/1998 | Kopera | |
| 5,871,858 A | * | 2/1999 | Thomsen | B60R 25/04 327/403 |
| 5,894,212 A | * | 4/1999 | Balogh | H02J 7/0026 320/116 |
| 5,910,875 A | * | 6/1999 | Tian | H02J 13/0048 361/1 |
| 5,945,810 A | * | 8/1999 | Fujita | H02J 7/0029 320/134 |
| 5,963,019 A | * | 10/1999 | Cheon | H02H 7/18 320/134 |
| 6,097,193 A | * | 8/2000 | Bramwell | G01R 31/007 324/427 |
| 6,127,741 A | * | 10/2000 | Matsuda | H02J 1/08 307/10.6 |
| 6,208,117 B1 | * | 3/2001 | Hibi | H02J 7/0021 320/134 |
| 6,222,343 B1 | | 4/2001 | Crisp et al. | |
| 6,271,709 B1 | * | 8/2001 | Kimura | H03K 17/168 327/170 |
| 6,417,579 B1 | * | 7/2002 | Lehnst | B60K 28/14 180/282 |
| 6,422,331 B1 | | 7/2002 | Ochiai et al. | |
| 6,449,544 B1 | * | 9/2002 | Nitschke | B60R 21/01 180/268 |
| 6,567,253 B1 | * | 5/2003 | Herwig | H02H 7/1225 361/18 |
| 6,646,845 B1 | | 11/2003 | Turner et al. | |
| 6,690,259 B2 | * | 2/2004 | Aslanidis | B60R 25/24 320/166 |
| 6,710,992 B2 | * | 3/2004 | Pannwitz | H02J 7/0031 361/90 |
| 6,738,914 B2 | | 5/2004 | Christopher | |
| 6,791,207 B2 | * | 9/2004 | Yoshida | B60R 16/0315 307/10.1 |
| 6,800,960 B2 | * | 10/2004 | Koos | F02N 11/0862 123/179.1 |
| 6,835,491 B2 | | 12/2004 | Garstein et al. | |
| 6,856,137 B2 | * | 2/2005 | Roden | B60L 3/0061 324/509 |
| 6,924,621 B2 | | 8/2005 | Jabaji et al. | |
| 6,960,899 B2 | * | 11/2005 | Kobayashi | H02J 7/0016 320/130 |
| 7,002,265 B2 | * | 2/2006 | Potega | B60L 11/185 307/149 |
| 7,176,654 B2 | | 2/2007 | Meyer et al. | |
| 7,259,538 B2 | | 8/2007 | Melton et al. | |
| 7,282,810 B2 | * | 10/2007 | Yoshida | B60R 16/0315 307/9.1 |
| 7,400,149 B2 | * | 7/2008 | Koster | G01R 31/3637 320/132 |
| 7,460,344 B2 | | 12/2008 | Hastings et al. | |
| 7,495,193 B2 | * | 2/2009 | Myers | B23K 9/092 219/130.51 |
| 7,495,417 B2 | | 2/2009 | Ishishita | |
| 7,521,878 B2 | * | 4/2009 | Green | H02M 5/458 315/209 R |
| 7,610,498 B2 | * | 10/2009 | Sutardja | G06F 1/1613 320/117 |
| 7,629,769 B2 | | 12/2009 | Gangstoe et al. | |
| 7,679,325 B2 | | 3/2010 | Seo | |
| 7,680,612 B2 | * | 3/2010 | Oohasi | B60L 3/0046 320/137 |
| 7,710,076 B2 | * | 5/2010 | Goto | H01M 10/48 320/132 |
| 7,728,599 B2 | * | 6/2010 | Tae | B60L 3/0038 320/116 |
| 7,742,885 B2 | * | 6/2010 | Oohasi | B60L 3/0038 320/137 |
| 8,022,663 B2 | | 9/2011 | Davis et al. | |
| 8,049,465 B2 | * | 11/2011 | Barsoukov | G01R 31/3606 320/132 |
| 8,093,859 B2 | * | 1/2012 | Aradachi | H01M 10/425 320/106 |
| 8,148,944 B2 | * | 4/2012 | Goto | H01M 10/44 320/128 |
| 8,154,250 B2 | | 4/2012 | Yu et al. | |
| 8,154,302 B2 | * | 4/2012 | Rochard | B60R 16/03 307/10.1 |
| 8,210,273 B2 | * | 7/2012 | Suzuki | B25F 5/00 173/2 |
| 8,212,528 B2 | * | 7/2012 | Takeda | H01M 10/48 320/134 |
| 8,325,463 B2 | * | 12/2012 | Peterson | H01G 7/04 320/166 |
| 8,330,426 B2 | * | 12/2012 | Suzuki | B25F 5/00 173/214 |

(56) References Cited

U.S. PATENT DOCUMENTS

| | | | | |
|---|---|---|---|---|
| 8,384,349 B2* | 2/2013 | Suzuki | | B25F 5/00 173/214 |
| 8,400,849 B1* | 3/2013 | Dornseifer | | G11C 5/144 365/145 |
| 8,463,563 B2 | 6/2013 | Tae et al. | | |
| 8,476,865 B2* | 7/2013 | Iwanaga | | B60K 6/445 180/65.21 |
| 8,502,503 B2* | 8/2013 | Densham | | H01M 10/42 320/116 |
| 8,653,793 B2* | 2/2014 | Ueki | | B60L 11/1861 320/132 |
| 8,674,661 B2* | 3/2014 | Yamada | | H02H 7/18 320/134 |
| 8,729,851 B2 | 5/2014 | Bobbin et al. | | |
| 8,742,724 B2* | 6/2014 | Suzuki | | B25F 5/00 310/50 |
| 8,742,725 B2* | 6/2014 | Tsujiko | | H01M 10/48 320/132 |
| 8,987,935 B2* | 3/2015 | King | | B60L 3/0046 307/10.1 |
| 8,988,909 B2* | 3/2015 | Murahashi | | B60L 3/0046 363/132 |
| 9,018,921 B2* | 4/2015 | Gurlahosur | | H02J 7/0081 320/134 |
| 9,035,620 B2* | 5/2015 | Kimura | | H02J 7/0031 320/134 |
| 9,041,358 B2* | 5/2015 | Kato | | H02J 7/0029 320/128 |
| 9,052,353 B2* | 6/2015 | Visyaschev | | G01R 31/085 |
| 9,071,049 B2* | 6/2015 | Densham | | H01M 10/42 |
| 9,156,356 B2* | 10/2015 | Rini | | H02J 7/0031 |
| 9,269,994 B2* | 2/2016 | Patino | | G01R 31/361 |
| 9,335,366 B2* | 5/2016 | Handy | | |
| 9,415,457 B2* | 8/2016 | Daniel | | B23K 9/091 |
| 9,419,431 B2* | 8/2016 | Prexl | | H02H 7/1213 |
| 9,478,968 B2* | 10/2016 | Blumschein | | G01R 31/025 |
| 2002/0050806 A1* | 5/2002 | Fujiwara | | H02J 7/0031 320/136 |
| 2002/0089318 A1* | 7/2002 | Armstrong, II | | G05F 1/56 323/285 |
| 2003/0080621 A1* | 5/2003 | Kirk | | H02H 3/087 307/10.7 |
| 2003/0155928 A1* | 8/2003 | Roden | | B60L 3/0061 324/509 |
| 2004/0251877 A1 | 12/2004 | Lee | | |
| 2005/0225257 A1* | 10/2005 | Green | | H02M 5/458 315/209 R |
| 2006/0207983 A1* | 9/2006 | Myers | | B23K 9/092 219/137 PS |
| 2006/0208850 A1* | 9/2006 | Ikeuchi | | H02J 7/0004 340/5.8 |
| 2006/0267557 A1* | 11/2006 | Nakano | | H02J 7/0031 320/134 |
| 2006/0271701 A1* | 11/2006 | Sutardja | | G06F 1/1613 709/238 |
| 2007/0145950 A1* | 6/2007 | Wang | | H02J 1/14 320/134 |
| 2007/0160900 A1* | 7/2007 | Nollet | | H02J 7/0063 429/50 |
| 2007/0257642 A1* | 11/2007 | Xiao | | H02J 7/0026 320/134 |
| 2008/0018268 A1* | 1/2008 | Green | | H02M 5/458 315/308 |
| 2008/0116851 A1* | 5/2008 | Mori | | H01M 2/34 320/134 |
| 2009/0058365 A1* | 3/2009 | Goto | | H01M 10/44 320/134 |
| 2009/0099799 A1* | 4/2009 | Barsoukov | | H01M 10/482 702/63 |
| 2009/0119034 A1* | 5/2009 | Oohasi | | B60L 3/0046 702/57 |
| 2009/0121683 A1* | 5/2009 | Goto | | H01M 10/48 320/134 |
| 2010/0085008 A1* | 4/2010 | Suzuki | | B25F 5/00 320/112 |
| 2010/0085010 A1* | 4/2010 | Suzuki | | B25F 5/00 320/132 |
| 2010/0109473 A1* | 5/2010 | Peterson | | H02N 11/002 310/306 |
| 2010/0141215 A1* | 6/2010 | Takeda | | H01M 10/48 320/136 |
| 2010/0157495 A1* | 6/2010 | Densham | | H01M 10/42 361/56 |
| 2010/0188050 A1 | 7/2010 | Asakura et al. | | |
| 2011/0012604 A1* | 1/2011 | Tsujiko | | H01M 10/48 324/427 |
| 2012/0001484 A1 | 1/2012 | Hsu | | |
| 2012/0026633 A1 | 2/2012 | Babb | | |
| 2012/0074898 A1* | 3/2012 | Schwartz | | H02J 7/0016 320/107 |
| 2012/0091930 A1 | 4/2012 | Takahashi et al. | | |
| 2012/0139504 A1* | 6/2012 | Buiatti | | G05F 1/67 320/166 |
| 2012/0169288 A1* | 7/2012 | Ueki | | B60L 11/1861 320/134 |
| 2012/0170157 A1 | 7/2012 | Holsen et al. | | |
| 2012/0319658 A1* | 12/2012 | White | | H02J 7/0016 320/134 |
| 2013/0003429 A1* | 1/2013 | Murahashi | | B60L 3/0046 363/56.01 |
| 2013/0026994 A1* | 1/2013 | Morikawa | | G01R 31/3658 320/134 |
| 2013/0107405 A1* | 5/2013 | Blumschein | | G01R 31/025 361/79 |
| 2013/0119931 A1* | 5/2013 | Klesyk | | H03K 5/04 320/109 |
| 2013/0123777 A1* | 5/2013 | Monson | | H02J 7/00 606/41 |
| 2013/0154564 A1* | 6/2013 | Goto | | H01M 10/48 320/112 |
| 2013/0154581 A1* | 6/2013 | Ureel | | H02J 7/025 320/167 |
| 2013/0169038 A1* | 7/2013 | King | | B60L 3/0046 307/10.1 |
| 2013/0169235 A1* | 7/2013 | Patino | | G01R 31/361 320/136 |
| 2013/0200690 A1* | 8/2013 | Rini | | H02J 7/0031 307/9.1 |
| 2013/0301173 A1* | 11/2013 | Densham | | H01M 10/42 361/56 |
| 2013/0325303 A1* | 12/2013 | Kiuchi | | G01R 31/3624 701/112 |
| 2014/0035359 A1* | 2/2014 | Graf | | B60R 16/033 307/9.1 |
| 2014/0091618 A1 | 4/2014 | Jeong | | |
| 2014/0111219 A1* | 4/2014 | Visyaschev | | G01R 31/085 324/522 |
| 2014/0167654 A1* | 6/2014 | Brockerhoff | | H02P 7/00 318/139 |
| 2014/0306662 A1* | 10/2014 | Kim | | H02J 7/0016 320/118 |
| 2014/0347005 A1* | 11/2014 | Zhou | | H02J 7/007 320/134 |
| 2015/0069829 A1* | 3/2015 | Dulle | | B60R 16/03 307/9.1 |
| 2015/0180091 A1* | 6/2015 | Dupont | | H02H 7/18 429/61 |
| 2015/0333502 A1* | 11/2015 | Prexl | | H02H 7/1213 361/18 |
| 2015/0333546 A1* | 11/2015 | Ono | | H02J 7/00 320/134 |
| 2015/0333555 A1* | 11/2015 | Ono | | H02J 7/00 320/134 |
| 2015/0372517 A1* | 12/2015 | Lee | | H01M 10/4207 320/134 |
| 2015/0377948 A1 | 12/2015 | Zhang et al. | | |

(56) References Cited

U.S. PATENT DOCUMENTS

| | | | | |
|---|---|---|---|---|
| 2016/0064970 A1* | 3/2016 | Shimizu | ............... | H02J 11/00 |
| | | | | 320/134 |
| 2016/0105054 A1* | 4/2016 | Horito | ............. | H01M 10/425 |
| | | | | 320/134 |
| 2016/0231382 A1* | 8/2016 | Hirose | ............. | G01R 31/3277 |
| 2016/0276114 A1* | 9/2016 | Reed, Sr. | ........... | G01R 31/3277 |
| 2016/0344178 A1 | 11/2016 | Wortberg et al. | | |
| 2017/0082693 A1* | 3/2017 | Leidich | ............. | G01R 31/025 |

FOREIGN PATENT DOCUMENTS

| | | | | |
|---|---|---|---|---|
| CN | 202513609 | | 10/2012 | |
| CN | 103227454 A | | 7/2013 | |
| WO | WO 2009049227 A2 * | | 4/2009 | ......... G01R 31/3606 |
| WO | WO 2009049227 A3 * | | 8/2009 | ......... G01R 31/3606 |

OTHER PUBLICATIONS http://www.mpoweruk.com/leadacid.htm . Seen Apr. 12, 2017.*
PCT/US2015/037085 International Search Report and Written Opinion dated Oct. 7, 2015.

* cited by examiner

SHORT CIRCUIT WAKE-UP SYSTEM AND METHOD FOR AUTOMOTIVE BATTERY WHILE IN KEY-OFF POSITION

BACKGROUND

The present disclosure generally relates to the field of batteries and battery modules. More specifically, the present disclosure relates to high voltage battery connectors that may be used in vehicular contexts, as well as other energy storage/expending applications.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 volt or 130 volt systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

The battery-powered electrical systems in xEVs may include mechanisms to electrically remove lithium ion battery modules from electrical systems of the vehicles when a short circuit condition occurs anywhere in the electrical systems. Even with the removal of the lithium ion battery modules from the electrical systems of the vehicles, there is still a possibility that terminals of the lithium ion battery modules may experience short circuit conditions. Therefore, short circuit protection circuitry may isolate the lithium ion battery modules if the short circuit conditions occur. One issue with short circuit protection circuitry is that it consumes power while detecting occurrences of the short circuit conditions. Hence, in situations where a battery may not be recharged for long periods of time, the power draw of the short circuit protection circuitry can discharge the battery.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to batteries and battery modules. More specifically, the present disclosure relates to all electrochemical and electrostatic energy storage technologies (e.g. ultracapacitors, nickel-zinc batteries, nickel-metal hydride batteries, and lithium batteries). Particular embodiments are directed to lithium ion battery cells that may be used in vehicular contexts (e.g., hybrid electric vehicles) as well as other energy storage/expending applications (e.g., energy storage for an electrical grid).

More specifically, the present disclosure relates to a short circuit detection and protection system for the battery modules. When a vehicle enters a sleep mode or a key-off position, it may be advantageous to detect short circuits in the battery module using minimal energy. To reduce energy consumption, a detection circuit may alert a hibernating processor in a battery control unit of a possible short circuit condition by providing a signal that may wake-up the processor. Upon receiving the signal, the processor may instruct the battery control unit to open a relay and electrically remove one or more battery modules from a battery system.

Accordingly, in a first embodiment, an automotive battery system may include a first battery coupled to an electrical system, and the first battery may include a first battery chemistry. Additionally, the automotive battery system may also include a second battery coupled in parallel with the first battery and coupled to the electrical system. Further, the automotive battery system may include a switch coupled to a positive terminal of the second battery, and the switch may electrically couple or decouple the second battery to or from the electrical system. Furthermore, the automotive battery system may include a battery control unit that detects a short circuit condition of the first battery, the second battery, or both, and the battery control unit may decouple the second battery from the electrical system by opening the switch upon detecting the short circuit condition.

In another embodiment, a method for operating a short circuit detection and protection system of an automotive battery system may include powering down vehicle system electronics except for a wake-up control unit. Further, the method may include comparing an instantaneous rate of change of a voltage output by a battery module to a predetermined threshold voltage. Furthermore, the method may include providing a wake-up signal to short circuit detection electronics when the instantaneous rate of change of the voltage output is greater than the predetermined threshold voltage, and determining via the short circuit detection electronics whether a short circuit condition exists. Additionally, the method may include opening a switch coupled between an individual battery within the battery module and a terminal of the battery module when the short circuit condition exists.

In yet another embodiment, a battery module for use in a vehicle may include a housing, a first terminal and a second terminal, a first battery disposed in the housing and coupled across the first terminal and the second terminal, and a second battery disposed in the housing, coupled in parallel with the first battery, and coupled to the first terminal and the second terminal. Additionally, the battery module may include a switch disposed between a positive terminal of the first battery and the first terminal and a battery control unit that may control operation of the first battery, the second battery, and the switch. Further, the battery module may include a wake-up control unit electrically coupled to the first terminal, which may detect a potential short circuit condition and provide a wake-up signal to the battery control unit upon detection of the potential short circuit condition to wake-up the battery control unit when the vehicle is in a vehicle hibernation mode. Furthermore, the battery module may include a capacitor bank disposed within the housing to provide power to the battery control unit and the switch after the wake-up control unit awakens the battery control unit.

DRAWINGS

Various aspects of this disclosure may be better understood upon reading the following detailed description and upon reference to the drawings in which.

DETAILED DESCRIPTION

Figure 1:
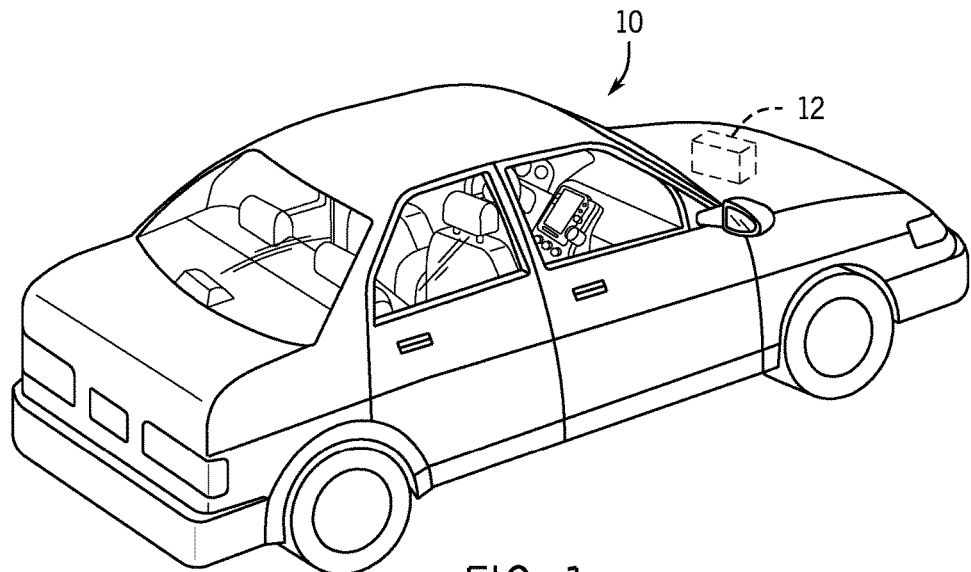
FIG. 1 is perspective view of a vehicle (an xEV) having a battery system contributing all or a portion of the power for the vehicle, in accordance with an embodiment of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed above, dual battery xEV vehicle systems may provide advantages over traditional gas-powered vehicle technology. Further, dual battery xEV technology has led to improvements in fuel economy and/or reductions in undesirable emissions compared to more traditional gas-powered vehicles. For example, regenerative braking vehicles capture and store electrical energy generated when the vehicle is braking or coasting. The captured electrical energy may then be utilized to supply power to the vehicle's electrical system. As another example, battery modules in accordance with present embodiments may be incorporated with or provide power to stationary power systems (e.g., non-automotive systems).

Based on the advantages over traditional gas-power vehicles, manufactures, which generally produce traditional gas-powered vehicles, may desire to utilize improved vehicle technologies (e.g., regenerative braking technology) within their vehicle lines. Often, these manufactures may utilize one of their traditional vehicle platforms as a starting point. Accordingly, since traditional gas-powered vehicles are designed to utilize 12 volt battery systems, a 12 volt lithium ion battery may be used to supplement a 12 volt lead-acid battery. More specifically, the 12 volt lithium ion battery may be used to more efficiently capture electrical energy generated during regenerative braking and subsequently supply electrical energy to power the vehicle's electrical system.

However, as advancements occur with vehicle technologies, high voltage electrical devices may be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12 volt lithium ion battery may be boosted using a DC-DC converter to supply power to the high voltage devices. Additionally or alternatively, a 48 volt lithium ion battery may be used to supplement a 12 volt lead-acid battery. More specifically, the 48 volt lithium ion battery may be used to more efficiently capture electrical energy generated during regenerative braking and subsequently supply electrical energy to power the high voltage devices.

Thus, the design choice regarding whether to utilize a 12 volt lithium ion battery or a 48 volt lithium ion battery may depend directly on the electrical devices used included in a particular vehicle. Nevertheless, although the voltage characteristics may differ, the operational principles of a 12 volt lithium ion battery and a 48 volt lithium ion battery are generally similar. More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12 volt lithium ion battery and a 12 volt lead-acid battery. However, one of ordinary skill in art should be able to adapt the present techniques to other battery systems, such as a battery system with a 48 volt lithium ion battery and a 12 volt lead-acid battery.

With the preceding in mind, the present disclosure describes techniques for controlling operation of a battery system to detect short circuit conditions and to protect the vehicle and the batteries from short circuit conditions. For example, embodiments detect short circuit conditions and remove one or more of the batteries from an electrically system of the vehicle. More specifically, when an instantaneous rate of change of voltage output by the batteries reaches a predetermined level, a signal may be provided to a battery control unit to determine whether a short exists. Upon the determination that a short is present in the battery system, one or more batteries may be electrically isolated from the electrical system. Thus, the techniques described herein enable a short circuit detection and protection system to improve detection efficiency and limit power consumed by the short circuit detection and protection system.

To help illustrate, FIG. 1 is a perspective view of an embodiment of a vehicle 10, which may utilize a regenerative braking system. Although the following discussion is presented in relation to vehicles with regenerative braking systems, the techniques described herein may be applied to other vehicles including xEV and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
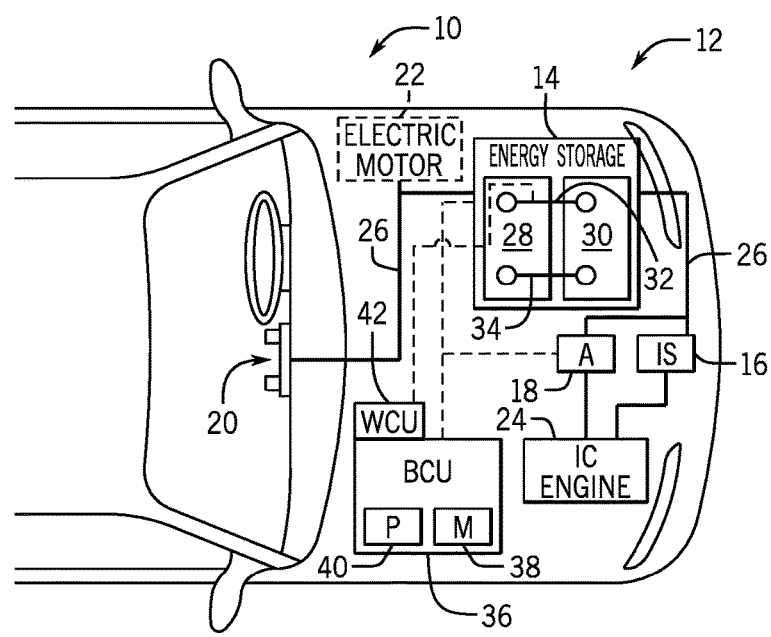
FIG. 2 is a cutaway schematic view of the xEV of FIG. 1 in the form of a hybrid electric vehicle (HEV), in accordance with an embodiment of the present approach.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

More specifically, the energy storage component 14 may capture/store generated electrical energy and output electrical energy to power each of these components, as well as others. In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, the energy storage component 14 depicted in FIG. 2 supplies power to the vehicle console 20 and the ignition system 16 to start (e.g., crank) the internal combustion engine 24. In some embodiments, the ignition system 16 may include a traditional starter and/or a belt starter generator (BSG).

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. In other words, the energy storage component 14 may capture electrical energy generated during regenerative braking.

To facilitate capturing and supplying electric energy, the energy storage component 14 may be coupled to the vehicle's electric system via a bus 26. For example, the bus 26 may enable the energy storage component 14 to receive electrical energy generated by the alternator 18 and/or the electric motor 22. Additionally, the bus may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, the energy storage component 14 may include multiple battery modules. For example, in the depicted embodiment, the energy storage component 14 includes a first battery module 28 and a second battery module 30, which each includes one or more battery cells. In other embodiments, the energy storage component 14 may include any number of battery modules. Additionally, although the first battery module 28 and the second battery module 30 are depicted adjacent to one another, they may be positioned in different areas around the vehicle. For example, the second battery module 30 may be positioned in or about the interior of the vehicle 10 while the first battery module 28 may be positioned under the hood of the vehicle 10.

More specifically, in some embodiments, the energy storage component 14 may include multiple battery modules to utilize multiple different battery chemistries. For example, the first battery module 28 may utilize a lead-acid battery chemistry and the second battery module 30 may utilize a lithium ion battery chemistry. In such an embodiment, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

Figure 3:
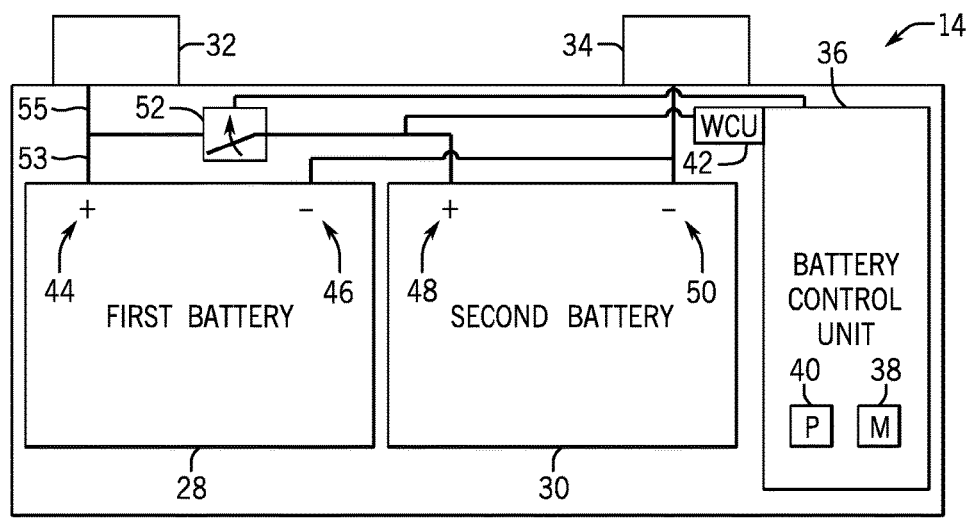
FIG. 3 is a schematic view of a battery system with a first battery, a second battery, and a battery control unit, in accordance with an embodiment of the present approach.

To facilitate supply of power from the battery system 12 to the various components in the vehicle's electrical system (e.g., HVAC system and vehicle console 20), the energy storage component 14 (i.e., battery module) includes a first terminal 32 and a second terminal 34. In some embodiments, the second terminal 34 may provide a ground connection and the first terminal 32 may provide a positive voltage ranging between 7-18 volts. A more detailed view of an embodiment of the energy storage component 14 represented as a battery module 14 is depicted in FIG. 3. As previously noted, the battery module 14 may have dimensions comparable to those of a typical lead-acid battery to limit modifications to the vehicle 10 design to accommodate the battery system 12. For example, the battery module 14 may be of similar dimensions to an H6 battery, which may be approximately 13.9 inches×6.8 inches×7.5 inches. As depicted, the battery module 14 may be included within a single continuous housing. In other embodiments, the battery module 14 may include multiple housings coupled together (e.g., a first housing including the first battery 28 and a second housing including the second battery 30). In still other embodiments, as mentioned above, the battery module 14 may include the first battery module 28 located under the hood of the vehicle 10, and the second battery module 30 may be located within the interior of the vehicle 10.

As depicted, the battery module 14 includes the first terminal 32, the second terminal 34, a first battery (e.g., a lead acid battery) 28, a second battery 30 (e.g., a lithium ion battery), and a battery control unit 36. As used herein, the battery control unit 36 generally refers to control components that control operation of the battery system 12, such as relays within the battery module or switches in the alternator 18. The operation of the battery module 14 may be controlled by the battery control unit 36. For example, the battery control unit 36 regulate amount of electrical energy captured/supplied by each battery module 28 or 30 (e.g., to de-rate and re-rate the battery system 12), perform load balancing between the batteries, control charging and discharging of the batteries (e.g., via relays or DC/DC converters), determine a state of charge of each battery and/or the entire battery module 14, activate an active cooling mechanism, activate a short circuit protection system, and the like.

Accordingly, the battery control unit 36 may include one or more memory 38 and one or more processor 40 programmed to execute control algorithms for performing such tasks. More specifically, the one or more processor 40 may include one or more application specific integrated circuits (ASICs), one or more field programmable gate arrays (FPGAs), one or more general purpose processors, or any combination thereof. Additionally, the one or more memory 38 may include volatile memory, such as random access memory (RAM), and/or non-volatile memory, such as read-only memory (ROM), optical drives, hard disc drives, or solid-state drives. In some embodiments, the battery control unit 36 may include portions of a vehicle control unit (VCU) and/or a separate battery control module. Additionally, as depicted, the battery control unit 36 may be included separate from the battery module 14, such as a standalone module. In other embodiments, as depicted in FIG. 3, the battery control unit 36 may be included within the battery module 14.

Additionally, as depicted in FIG. 2, the first battery 28 and the second battery 30 are connected in parallel across the first terminal 32 and the second terminal 34 to enable charging and discharging of the batteries. As described above, the battery terminals 32 and 34 may output the power stored in the battery module 14 to provide power to the vehicle's electrical system. Further, the battery terminals 32 and 34 may also input power to the battery module 14 to enable the first battery 28 and the second battery 30 to charge, for example, when the alternator 18 generates electrical power through regenerative braking.

Furthermore, the battery module may include a wake-up control unit 42. As discussed in greater detail below, the wake-up control unit 42 may receive a voltage signal from the first terminal 32 during a vehicle hibernation mode, which may include a mode of the vehicle 10 while the vehicle 10 is in a key-off position. When the wake-up control unit 42 receives a signal indicating a potential short circuit condition of one or both of the batteries 28 and 30, the wake-up control unit 42 may provide a "wake-up" signal to the processor 40 of the battery control unit 36 to begin a short circuit detection and protection process. The short circuit detection and protection process may test the batteries 28 and 30 for a short circuit condition and protect the batteries 28 and 30 from the short circuit condition.

To provide more detail as to the battery module 14, FIG. 3 illustrates a schematic view of components of the battery module 14. As depicted, the first battery 28 and the second battery 30 are separate within the battery module 14, which enables each to be configured based on desired characteristics, such as output voltage. For example, the output voltage of the first battery 28 and second battery 30 may depend on the configuration of individual battery cells within each (e.g., in serial or parallel) and the battery chemistries selected. Further, the configuration of battery cells and the battery chemistries selected may result in certain advantages specific to multiple battery chemistries and cell arrangements. For example, the advantages may include an increased range in charging voltages, or the advantages may include varied power and charging capacities within the battery module 14.

Additionally, as discussed above, the first battery 28 and the second battery 30 may couple to the first terminal 32 and the second terminal 34 in a parallel manner. In other words, a positive terminal 44 of the first battery 28 may electrically couple to the first terminal 32 of the battery module 14, and a negative terminal 46 may electrically couple to the second terminal 34 of the battery module 14. In a similar manner, a positive terminal 48 of the second battery 30 may electrically couple to the first terminal 32 of the battery module 14, and a negative terminal 50 of the second battery 30 may electrically couple to the second terminal 34 of the battery module 14. In this manner, the two batteries 28, 30 may electrically couple in parallel with each other to the bus 26 to provide power to various components of the electrical system of the vehicle 10.

Further, the wake-up control unit 42 may receive a voltage signal from the positive terminal 48, the positive terminal 44, or both to determine a possible short circuit condition of the second battery 30, the first battery 28, or both. Upon receiving a voltage signal from the first and/or second batteries 28, 30, the wake-up control unit 42 may provide a signal to "wake-up" the battery control unit 36 while the vehicle is in a hibernating mode or a key-off mode. Because the battery control unit 36 is not active until the battery control unit 36 receives the "wake-up" signal, minimal energy is used to monitor the batteries 28, 30 for a potential short circuit condition. When the battery control unit 36 reenergizes, the battery control unit 36 may make a more accurate determination of whether a short circuit condition is present, and, upon verifying the presence of the short circuit condition, the battery control unit 36 may instruct a switch 52 to open. As used herein, a "switch" is intended to describe any mechanism that can selectively connect and disconnect the batteries 28, 30, such as a hardware switch, a contactor, a relay, or a bi-stable relay.

When the battery control unit 36 receives the possible short-circuit condition indication from the wake-up control unit 42, the battery control unit 36 may take another reading of the battery system 12 to determine with greater accuracy whether the short circuit condition is present. This additional reading and determination may consume more power than the wake-up control unit 42. Therefore, while the vehicle is in a hibernation mode or a key-off mode and not generating electricity to charge the batteries 28, 30, the battery system 12 may only utilize the additional reading and determination of the battery control unit 36 after the wake-up control unit 42 detects the potential short circuit.

Further, it may be appreciated that in the illustrated embodiment, the switch 52 may be in a closed position as a default position for the system. The switch 52 may be moved to an open position after detection of a short circuit condition to electrically isolate one or both of the batteries 28, 30 from the electrical system of the vehicle 10. Additionally, as illustrated in FIG. 3, the position of the switch 52 is along a path from the second battery 30 to the first terminal 32. In this particular embodiment, the switch 52 may electrically isolate the second battery 30 from the electrical system. However, the switch 52 may also be located at positions 53 or 55. At the position 53, the switch 52 may function to isolate the first battery 28 from the electrical system of the vehicle 10 upon opening after a short circuit condition detection. Moreover, at position 55, the switch 52 may isolate both batteries 28 and 30 from the electrical system of the vehicle 10 upon opening after a short circuit condition detection. It may also be appreciated that multiple switches 52 at multiple positions may also be contemplated depending on various types of short circuit conditions that the battery control unit 36 may detect. For example, one switch 52 may be located at the position illustrated in FIG. 3 while another switch 52 is located at the position 53. In this manner, the battery control unit 36 may electrically isolate one or both of the batteries 28, 30 upon detection of the short circuit condition.

Figure 4:
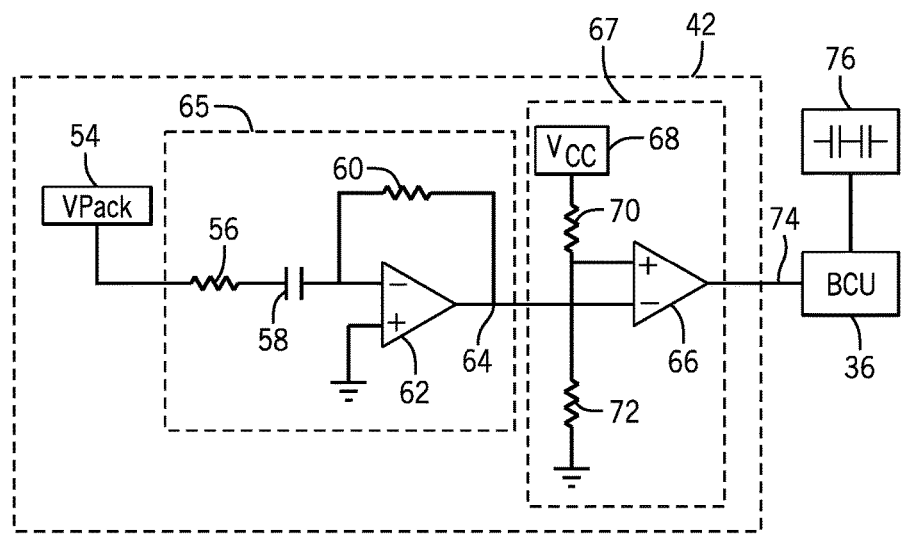
FIG. 4 is a schematic diagram of a wake-up control unit of the battery system of FIG. 3, in accordance with an embodiment of the present approach.

With the foregoing in mind, FIG. 4 is a schematic diagram of the wake-up control unit 42. As discussed above, the wake-up control unit 42 may provide a low power system for preliminarily detecting a potential short-circuit condition at the batteries 28 and 30. In the illustrated embodiment, the wake-up control unit 42 may receive a voltage signal 54 from the first terminal 32 of the battery module 14 (i.e., a battery pack voltage signal). Once the voltage signal 54 is received at the wake-up control unit 42, resistor 56, capacitor 58, resistor 60, and op-amp 62 may manipulate the voltage signal 54 in such a way as to make an output 64 of the op-amp 62 represent an instantaneous rate of change of the voltage output (i.e., dv/dt) at the first terminal 32 of the battery module 14. A configuration of the electronic components coupled around the op-amp 62 creates an op-amp differentiator 65 (i.e., a high-pass filter). The op-amp differentiator 65 manipulates the input provided by the voltage signal 54 to determine the instantaneous rate of change of the voltage output by the battery module 14 with an equation:

$$V_{out} = -RC\frac{dv_{in}}{dt}, \qquad \text{(Equation 1)}$$

wherein R is the resistor 60, C is the capacitor 58, Vout is the output 64, and $dv_{in}/dt$ is the instantaneous rate of change of the voltage output at the first terminal 32. Therefore, the op-amp differentiator 65 may provide a voltage output representing a measurement of the dv/dt of the battery module 14.

Further, the dv/dt of the battery module 14 may generally be low while the vehicle 10 is in a hibernation mode or a key-ff mode. For example, the dv/dt may approach a zero value due to minimal amounts of battery energy leakage. Growth of the dv/dt may indicate a short circuit condition of the battery module 14 resulting in an increased loss of energy in the batteries 28 and 30. Therefore, an increase in the dv/dt provided at the output 64 may represent a likelihood of a short circuit condition within the battery module 14.

After manipulating the voltage signal 54, a positive terminal of a comparator 66 may receive the output 64. The comparator 66 may be a component of a threshold comparison unit 67. As such, the comparator 66 may compare the output 64 with a predetermined threshold voltage value provided to a negative input of the comparator 66. The predetermined threshold voltage value may represent a value at which the output 64 is likely to represent a short circuit condition. For example, the threshold voltage value may be selected by providing a known voltage input 68 to a voltage divider comprising resistors 70 and 72. By manipulating values of the resistors 70 and 72, the threshold voltage value may be selected to compare with the output 64. Should the output 64 exceed the threshold voltage value (i.e., the dv/dt exceeds a predetermined value deemed acceptable), the comparator 66 may provide a high signal (i.e., a voltage greater than zero) at an output 74. On the other hand, should the output 64 not exceed the threshold voltage value (i.e., the dv/dt falls within an acceptable range), the comparator 66 may provide a low signal (i.e., a voltage of substantially zero) at the output 74.

Further, the output 74 may provide an activation signal to instruct the battery control unit 36 to "wake-up." For example, the output 74 may be provided to a clock input of the processor 40 of the battery control unit 36. Once a high signal is provided by the output 74 to the clock input, the battery control unit 36 may begin a short circuit detection and protection process. Further, because the battery control unit 36 may use 7V or more to open the switch 52 and isolate one or more of the batteries 28, 30, and because energy stored within the batteries 28, 30 may be depleted by a short circuit condition, a capacitor bank 76 may be provided coupled to the battery control unit 36. The capacitor bank 76 may provide a bank of capacitors sufficient in size to provide power to the battery control unit 36 for carrying out the short circuit detection and protection process. For example, a 500 µF capacitor bank 76 may provide sufficient power to the battery control unit 36 to detect down to a 0Ω short circuit and provide sufficient power to open the switch 52. Further, the 500 µF capacitor bank may be installed at a minimal cost and provide minimum quiescent current draw impact (e.g., around 50-300 µA).

Figure 5:
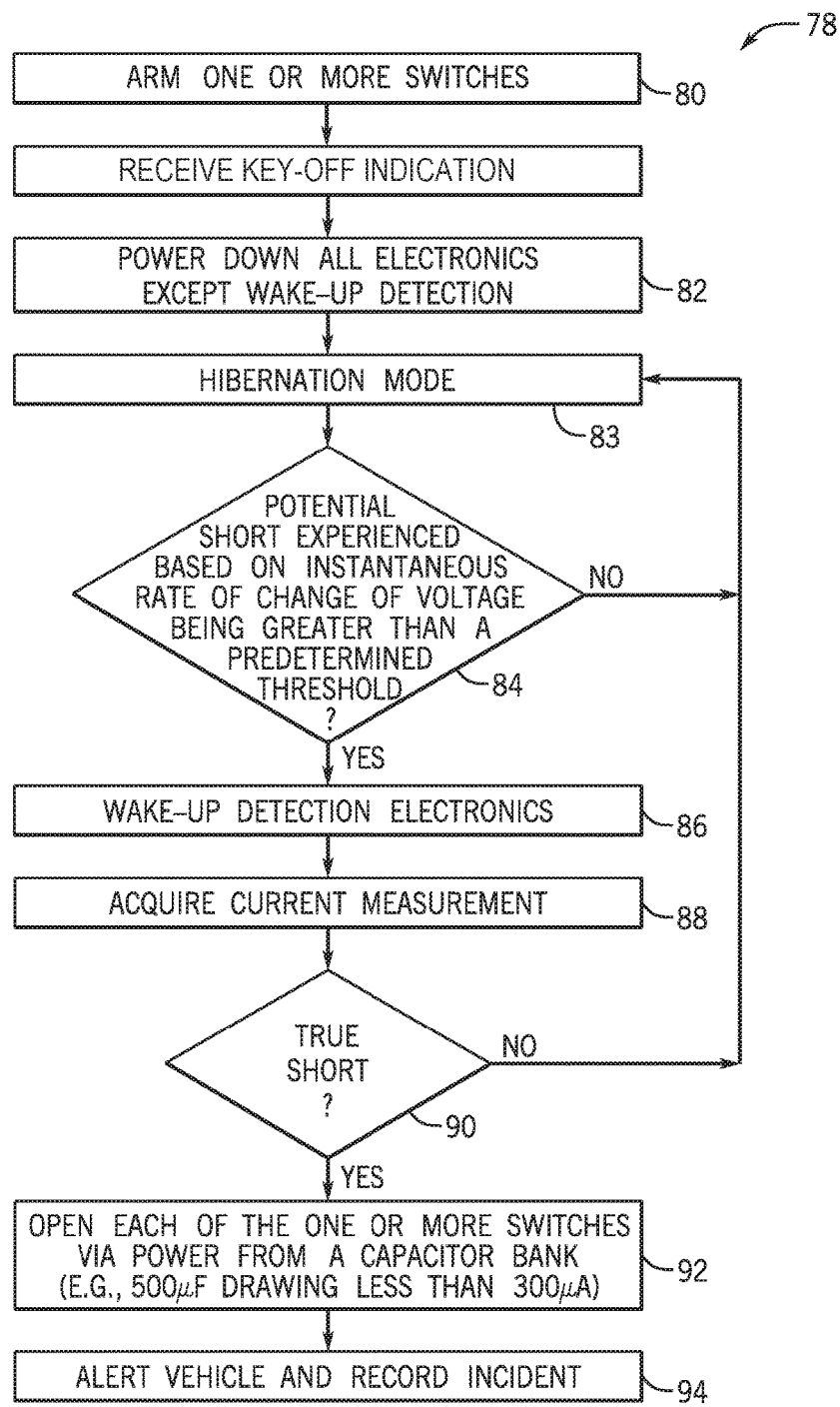
FIG. 5 is a process flow diagram describing a method for detecting a short circuit condition and electrically removing a battery from the battery system, in accordance with an embodiment.

As discussed above, the wake-up control unit 42 may be used to provide a preliminary indication of a short circuit condition at the battery module 14. To illustrate this function, FIG. 5 is a process flow diagram describing a method 78 for detecting a short circuit condition and electrically removing one or more of the batteries 28, 30 from the battery system 12. Initially, the method 78 may initiate at block 80 when the battery control unit 36 arms the switch 52 by ensuring that the switch is closed prior to powering down the battery when the vehicle 10 enters a hibernation mode or a key-off mode.

After arming the switch 52, the battery module 14 may be in position for the battery control unit 36 and the vehicle 10 to power down all electronics of the vehicle 10 except for the wake-up control unit 42 at block 82. While the battery module 14 may be electrically removed from the electrical system of the vehicle 10 after shutting-down the electronics, it remains theoretically possible that the terminals 32, 34 of the battery module 14 may experience a short circuit condition. Therefore, the wake-up control unit 42 may remain coupled to the first terminal 32 even after removal of the other electronic components of the vehicle 10.

Upon powering down all electronics of the vehicle 10 except for the wake-up control unit 42, the vehicle may enter a hibernation mode at block 83. Entering the hibernation mode may be a result of receiving a key-off indication by the vehicle 10 at the battery module 14. During the hibernation mode, the internal combustion engine 24 may also be powered down along with the electronics of the vehicle 10. Further, the hibernation mode may also function as a starting point for the wake-up detection electronics of the wake-up control unit 42 to monitor the battery module 14 for potential short circuit conditions.

Subsequently, the wake-up control unit 42 may monitor the voltage provided at the first terminal 32 for an indication of a potential short circuit condition at block 84. As discussed above, the dv/dt of the battery module 14 is monitored and compared to a threshold to determine if the dv/dt exceeds an acceptable range. This may be accomplished via low cost and low energy consuming electronics. Should the dv/dt value fail to exceed the threshold, the method 78 may return to the hibernation mode of block 83 to make another determination of whether a potential short circuit condition exists.

On the other hand, if a potential short circuit condition is indicated at block 84, then the wake-up control unit 42 may provide a "wake-up" signal to the battery control unit 36 to "wake-up" short circuit detection electronics of the battery control unit 36 at block 86. As discussed above, the wake-up control unit 42 may provide a high signal to the clock input of the processor 40 of the battery control unit 36. The short circuit detection electronics within the battery control unit 36 may begin carrying out detection instructions upon receiving the rising edge of the high signal at the clock input.

Once the short circuit detection electronics commence carrying out the detection instructions in the battery control unit 36, the short circuit detection electronics may more accurately determine whether an actual short circuit condition exists at block 88. This may be accomplished by taking an accurate current measurement from the first terminal 32 of the battery module 14. If a high current is measured, at block 90, to indicate a true short circuit condition (i.e., a current above a prospective short circuit current value for the battery system 12), the battery control unit 36 may immediately open the switch 52 to remove one or more of the batteries 28, 30 from the electrical system of the vehicle 10 at block 92. Otherwise, the method 78 may return to the hibernation mode at block 83 to make another determination of whether a potential short circuit condition exists and to provide the wake-up signal upon detection of a potential short circuit condition, as discussed above.

If the true short circuit condition is detected at block 90 and the switch 52 is opened at block 92, then the battery control unit 36 may alert the vehicle 10 of the incident and record the incident within the memory 38 of the battery control unit 36 or any other memory unit within the vehicle 10 at block 94. By alerting the vehicle 10 of the incident and logging the incident, a driver of the vehicle 10 may be alerted that the vehicle 10 may need service. Further, a technician may efficiently diagnose the problem to expedite the servicing process.

Figure 6:
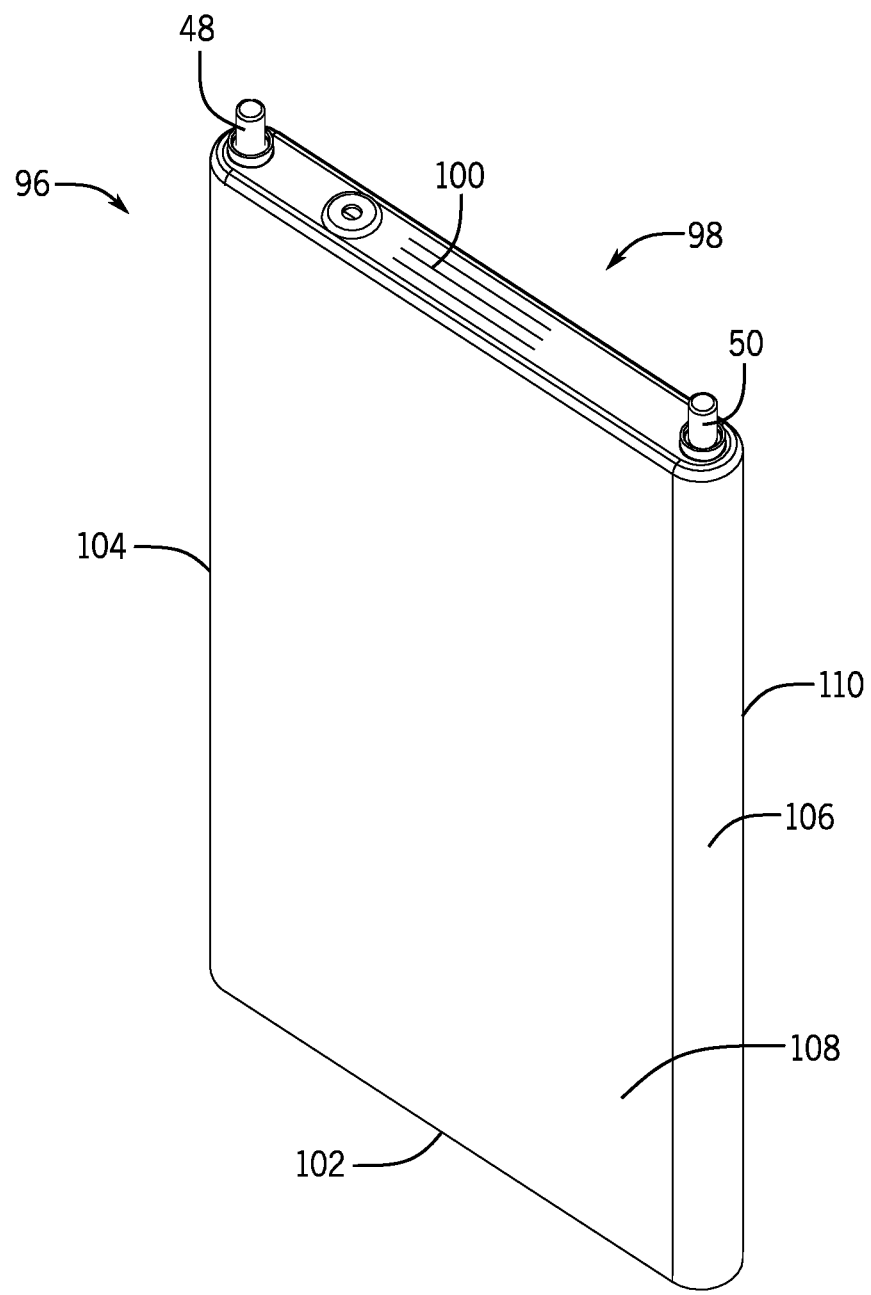
FIG. 6 is a perspective view of a prismatic battery cell used in a lithium ion battery, in accordance with an embodiment of the present approach.

One embodiment of the battery cells described herein is illustrated in FIG. 6. The battery cells described herein may be prismatic battery cells 96, where a prismatic battery cell 96, as defined herein, includes a prismatic case that is generally rectangular in shape. In contrast to pouch cells, the prismatic casing is formed from a relatively inflexible, hard (e.g., metallic) material. However, it should be noted that certain of the embodiments described below may incorporate pouch cells in addition to or in lieu of prismatic battery cells. In accordance with present embodiments, each prismatic battery cell may include a top casing portion 98, where a set of cell terminals 48, 50 (e.g., positive and negative cell terminals) are located. One or more cell vents 100 may also be located on the top casing portion 98. The prismatic cell casing also includes a bottom casing portion 102 positioned opposite the top casing portion 98. First and second sides 104, 106, which may be straight or rounded, extend between the bottom and top casing portions 102, 98 in respective positions corresponding to the cell terminals 48, 50. First and second faces 108, 110, which may be flat (as shown) or rounded, couple the first and second sides 104, 106 at opposing ends of each cell 96.

One or more of the disclosed embodiments, alone or on combination, may provide one or more technical effects including detecting short circuit conditions while minimizing battery power drainage while the vehicle 10 is not recharging the batteries 28 and 30. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. An automotive battery system to be implemented in an automotive vehicle, comprising: a first battery configured to supply electrical power to an electrical system of the automotive vehicle when coupled to the electrical system;
    a first switch electrically coupled between the first battery and the electrical system, wherein the first switch is configured to electrically couple or decouple the first battery to or from the electrical system;

a wake-up control unit electrically coupled to a first terminal of the first battery, wherein the wake-up control unit is configured to, while the automotive vehicle is in a key-off position:
receive a voltage at the first terminal of the first battery;
determine an instantaneous rate of voltage change based on the voltage at the first terminal during a hibernation mode;
determine whether a short circuit is expected to be present in the automotive battery system based on whether the instantaneous rate of voltage change is greater than a predetermined threshold voltage value; and
provide an activation signal upon determining that the short circuit is expected to be present; and
a battery control unit communicatively coupled to the first switch and the wake-up control unit, wherein the battery control unit is configured to:
enter the hibernation mode upon receiving a key-off indication;
determine a current measured at the first terminal of the first battery upon waking up from the hibernation mode upon receiving the activation signal;
determine whether the short circuit is actually present in the automotive battery system based on whether the current measured at the first terminal is greater than a predetermined threshold current value; and
instruct the first switch to decouple the first battery from the electrical system upon determining that the short circuit condition is actually present.

2. The battery system of claim 1, wherein the wake-up control unit is configured to wake-up the battery control unit via the activation signal, wherein the battery control unit determines that the short circuit is expected to be present while the automotive vehicle is in the key-off position.

3. The battery system of claim 2, wherein, to determine whether the short circuit is expected to be present, the wake-up control unit is configured to:
determine whether the instantaneous rate of voltage change is greater than the predetermined threshold voltage value;
provide the activation signal to a short circuit detection electronics of the battery control unit upon determining that the short circuit is expected to be present when the instantaneous rate of voltage change is greater than the predetermined threshold voltage value; and
provide no activation signal to the short circuit detection electronics of the battery control unit upon determining that the short circuit is not expected to be present when the instantaneous rate of voltage change is less than the predetermined threshold voltage value.

4. The battery system of claim 3, wherein the wake-up control unit comprises an op-amp differentiator configured to manipulate the voltage at the first terminal of the first battery to a voltage representation of the instantaneous rate of voltage change.

5. The battery system of claim 4, wherein the wake-up control unit comprises a comparator configured to:
compare the voltage representation to the predetermined threshold voltage value; and
provide the activation signal to the short circuit detection electronics when the voltage representation is greater than the predetermined threshold voltage value.

6. The battery system of claim 1, comprising a capacitor bank configured to provide sufficient power to operate the battery control unit and the first switch during the short circuit condition.

7. The battery system of claim 6, wherein the capacitor bank comprises a total capacitance of around 500 μF.

8. The battery system of claim 6, wherein the capacitor bank is configured to draw less than around 300 μA of quiescent current.

9. The battery system of claim 1, comprising:
a second battery configured to supply electrical power to the electrical system when coupled to the electrical system, wherein the first battery comprises a first battery chemistry and the second battery comprises a second battery chemistry different from the first battery chemistry; and
a second switch electrically coupled between the second battery and the electrical system, wherein the second switch is configured to electrically couple or decouple the second battery to the electrical system;
wherein the battery control unit is communicatively coupled to the second switch and configured to instruct the second switch to decouple the second battery from the electrical system upon detecting the short circuit condition is actually present.

10. The battery system of claim 9, wherein second battery chemistry has a higher coulombic efficiency than the first battery chemistry.

11. The battery system of claim 10, wherein:
the first battery chemistry is a lead-acid chemistry; and
the second battery chemistry is a lithium ion chemistry.

12. The battery system of claim 1, wherein the first switch is a bi-stable relay.

13. A method for operating a short circuit detection and protection system of an automotive battery system in an automotive vehicle, comprising:
powering down vehicle system electronics except for a wake-up control unit when the automotive vehicle transitions from a key-on position to a key-off position; and
while the automotive vehicle is in the key-off position:
entering a hibernation mode of short circuit detection electronics upon receiving a key-off indication;
comparing, using the wake-up control unit, an instantaneous rate of voltage change based on a voltage output from a battery module to a predetermined threshold voltage value during the hibernation mode;
providing, using the wake-up control unit, a wake-up signal to short circuit detection electronics when a short circuit is expected to be present based on whether the instantaneous rate of voltage change is greater than the predetermined threshold voltage value;
determining, using the short circuit detection electronics, upon waking up from the hibernation mode once receiving the wake-up signal whether a short circuit condition exists based on whether a current output from the battery module is greater than a predetermined threshold current value; and
instructing a switch electrically coupled between an individual battery within the battery module and a terminal of the battery module when the short circuit detection electronics determines that the short circuit condition exists.

14. The method of claim 13, comprising providing power to the short circuit detection electronics and to the switch via a capacitor bank while the automotive vehicle is in the key-off position.

15. The method of claim 13, wherein determining whether the short circuit condition exist comprises:

determining whether a current measurement indicative of the current output from the battery module is greater than the predetermined threshold current value;

instructing the switch upon determining that the short circuit condition exists when the current measurement is greater than the predetermined threshold current value; and not instructing the switch upon determining the absence of the short circuit condition when the current measurement is less than the predetermined threshold current value.

16. The method of claim 13, wherein comparing the instantaneous rate of voltage change to the predetermined threshold voltage value comprises:

manipulating the voltage output from the battery module with an op-amp differentiator to output a voltage representation of the instantaneous rate of voltage change; and comparing the voltage representation to the predetermined threshold voltage value via a comparator that outputs the wake-up signal.

17. The method of claim 13, wherein providing the wake-up signal to the short circuit detection electronics comprises providing a high signal to a clock input of a processor of the short circuit detection electronics.

18. A battery module for use in a vehicle, comprising:
a housing;
a first terminal and a second terminal coupled to the housing;
a first switch disposed in the housing, wherein the first switch is electrically coupled to the second terminal;
a first battery disposed in the housing, wherein the first battery is electrically coupled between the first terminal and the switch;
a battery control unit communicatively coupled to the switch, wherein the battery control unit is configured to control operation of the first battery, a second battery, and the switch upon waking up from the hibernation mode once receiving a wake-up signal from the wake-up control unit, wherein the battery control unit is configured to enter a hibernation mode upon receiving a key-off indication, and wherein the battery control unit is configured to determine whether a short circuit condition exists based on whether a current at the first terminal is greater than a predetermined threshold current value upon receiving the wake-up signal;

a wake-up control unit electrically coupled to the first terminal and the second terminal, wherein the wake-up control unit is configured to, while the vehicle is in a key-off position:

determine whether a short circuit is expected to be present in the automotive battery system based on whether an instantaneous rate of voltage change of a voltage at the first terminal is greater than a predetermined threshold voltage value during the hibernation mode; and provide the wake-up signal to the battery control unit upon determining that the short circuit is expected to be present to wake-up the battery control unit from the hibernation mode; and a capacitor bank disposed within the housing and electrically coupled to the battery control unit and the switch, wherein the capacitor bank is configured to provide power used to operate the battery control unit and the switch while the vehicle is in the key-off position after the wake-up control unit provides the wake-up signal to the battery control unit.

19. The battery module of claim 18, wherein the wake-up control unit comprises an op-amp differentiator configured to determine an instantaneous rate of voltage change of the voltage at the first terminal.

20. The battery module of claim 19, wherein the wake-up control unit is configured to provide the wake-up signal to the battery control unit when an output of the op-amp differentiator is greater than a predetermined threshold voltage value.

21. The battery module of claim 18, comprising the second battery disposed in the housing, wherein:

the second battery is electrically coupled between the switch and the first terminal in parallel with the first battery; and the first battery comprises a first battery chemistry different from a second battery chemistry of the second battery.

* * * * *